US010777771B2

(12) United States Patent
Lee et al.

(10) Patent No.: US 10,777,771 B2
(45) Date of Patent: Sep. 15, 2020

(54) DISPLAY APPARATUS

(71) Applicant: SAMSUNG DISPLAY CO., LTD., Yongin-si, Gyeonggi-do (KR)

(72) Inventors: Juhee Lee, Yongin-si (KR); Jongwoo Park, Yongin-si (KR); Youngtae Choi, Yongin-si (KR); Daeyoun Cho, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/557,077

(22) Filed: Aug. 30, 2019

(65) Prior Publication Data
US 2020/0185647 A1 Jun. 11, 2020

(30) Foreign Application Priority Data

Dec. 10, 2018 (KR) ........................ 10-2018-0158383

(51) Int. Cl.
H01L 51/52 (2006.01)
H01L 27/32 (2006.01)
G09G 3/3283 (2016.01)
G09G 3/3266 (2016.01)

(52) U.S. Cl.
CPC ....... H01L 51/5256 (2013.01); G09G 3/3266 (2013.01); G09G 3/3283 (2013.01); H01L 27/3246 (2013.01); H01L 27/3258 (2013.01); H01L 27/3262 (2013.01); H01L 27/3276 (2013.01)

(58) Field of Classification Search
None
See application file for complete search history.

(56) References Cited

U.S. PATENT DOCUMENTS 9,054,059 B2 6/2015 Kim et al.
9,391,296 B2 7/2016 Park et al.
9,905,801 B2 2/2018 Kim
(Continued)

FOREIGN PATENT DOCUMENTS

KR 10-2014-0055529 A 5/2014
KR 10-2015-0025994 A 3/2015
(Continued)

Primary Examiner — Daniel Whalen
(74) Attorney, Agent, or Firm — Kile Park Reed & Houtteman PLLC

(57) ABSTRACT

A display apparatus includes a substrate, a display area including a plurality of pixels, a non-display area outside the display area, a first dam surrounding the display area, a second dam surrounding the first dam, a third dam between the display area and the first dam. The third dam including a first insulating layer and a second insulating layer on the first insulating layer, and a thin film encapsulation layer covering the display area, the thin film encapsulation layer including at least one inorganic encapsulation layer and at least one organic encapsulation layer. The third dam includes a first region in which the second insulating layer is spaced along a direction in which the first insulating layer extends, and a second region in which the second insulating layer is continuously present along the direction in which the first insulating layer extends, the second region not overlapping the first region.

25 Claims, 15 Drawing Sheets

(56) References Cited

U.S. PATENT DOCUMENTS

| | | | |
|---|---|---|---|
| 2015/0091030 A1* | 4/2015 | Lee | H01L 27/3246 |
| | | | 257/91 |
| 2017/0237038 A1* | 8/2017 | Kim | H01L 51/5253 |
| | | | 257/40 |
| 2017/0331058 A1* | 11/2017 | Seo | G02B 5/3016 |
| 2018/0013092 A1 | 1/2018 | Park | |
| 2018/0033830 A1 | 2/2018 | Kim et al. | |
| 2018/0151838 A1* | 5/2018 | Park | H01L 27/3258 |

FOREIGN PATENT DOCUMENTS

| | | |
|---|---|---|
| KR | 10-2018-0005328 A | 1/2018 |
| KR | 10-2018-0014398 A | 2/2018 |

\* cited by examiner

DISPLAY APPARATUS

CROSS-REFERENCE TO RELATED APPLICATION

Korean Patent Application No. 10-2018-0158383, filed on Dec. 10, 2018, in the Korean Intellectual Property Office, and entitled: "Display Apparatus," is incorporated by reference herein in its entirety.

BACKGROUND

1. Field

One or more embodiments relate to a display apparatus, and more particularly, to a display apparatus capable of effectively controlling overflow of a monomer in a narrow dead space of the display apparatus.

2. Description of the Related Art

A display apparatus is an apparatus for visually displaying data. Display apparatuses have been used for various purposes. In addition, since the thickness and weight of display apparatuses have been reduced, their range of utilization has increased.

A display apparatus includes a substrate that is partitioned into a display area and a non-display area outside the display area. A non-display area, in which non-display elements such as a pad portion, a plurality of wirings, a driving circuit portion, etc. are arranged, is a dead space that is not capable of realizing images. Recently, there has been increasing demand to further reduce dead spaces in display apparatuses.

SUMMARY

Embodiments are directed to a display apparatus including a substrate, a display area on the substrate, the display area including a plurality of pixels a non-display area outside the display area, a first dam surrounding the display area, a second dam outside the first dam, the second dam surrounding the first dam, a third dam between the display area and the first dam, the third dam including a first insulating layer and a second insulating layer, the second insulating layer being on the first insulating layer, and a thin film encapsulation layer covering the display area, the thin film encapsulation layer including at least one inorganic encapsulation layer and at least one organic encapsulation layer. The third dam includes a first region in which the second insulating layer is spaced along a direction in which the first insulating layer extends, and a second region in which the second insulating layer is continuously present along the direction in which the first insulating layer extends, the second region not overlapping the first region.

In the first region, the first insulating layer may include an extension that extends along the direction in which the first insulating layer extends, and a plurality of protrusions protruding from the extension towards the display area.

In the first region, a width of the first insulating layer may be greater than a width of the second insulating layer.

In the first region, a height from a surface of the substrate to an uppermost portion of the second insulating layer may be equal to or greater than a height from the surface of the substrate to an uppermost portion of the first dam.

Each of the pixels may include a first electrode, an emission layer on the first electrode, and a second electrode on the emission layer, the second electrode being arranged commonly throughout the plurality of pixels. A first power voltage line supplying a first power to each pixel may be located in the non-display area. A second power voltage line that supplies a second power to the second electrode may be spaced from the first power voltage line.

The first region of the third dam partially overlaps the second power voltage line.

The second dam may clad end portions of the second power voltage line.

The first dam may overlap the second power voltage line.

The second region of the third dam may partially overlap the first power voltage line.

In the second region, a width of an upper surface of the first insulating layer may be equal to a width of a lower surface of the second insulating layer.

In the second region, a height from a surface of the substrate to an uppermost portion of the second insulating layer may be equal to a height from the surface of the substrate to an uppermost portion of the first dam.

The display apparatus may further include a pixel-defining layer covering end portions of the first electrode and a spacer on the pixel-defining layer. The first insulating layer may include a same material as a material of the pixel-defining layer. The second insulating layer may include a same material as a material of the spacer.

A thin film transistor including an active layer, a gate electrode, a source electrode, and a drain electrode may be between each pixel and the substrate. A third insulating layer may be in the display area and the non-display area, the third insulating layer including at least one of insulating layers arranged between the active layer, the gate electrode, the source electrode, and the drain electrode. The third dam may further include the third insulating layer between the substrate and the first insulating layer.

The second dam may include the third insulating layer, the first insulating layer on the third insulating layer, and the second insulating layer on the first insulating layer.

The third insulating layer may include a first planarization layer and a second planarization layer. The first planarization layer may be in the display area and the non-display area, and the second planarization layer is on the first planarization layer. The second dam and the third dam may both include a same material as the first planarization layer and the second planarization layer.

The first dam may include a same material as one of the first planarization layer and the second planarization layer.

A height from a surface of the substrate to an uppermost portion of the second dam may be greater than a height from the surface of the substrate to an uppermost portion of the first dam.

Each of the at least one inorganic encapsulation layer includes a first inorganic encapsulation layer and a second inorganic encapsulation layer. Each of the at least one organic encapsulation layer may be between the at least one first inorganic encapsulation layer and the second inorganic encapsulation layer, respectively.

The at least one first inorganic encapsulation layer and the second inorganic encapsulation layer may be in direct contact with each other on an outer portion of the second dam.

The second electrode may extend to the non-display area and partially covers the first region of the third dam.

Embodiments are also directed to a display apparatus including a substrate, a display area on the substrate, the display area including a plurality of pixels, a non-display area outside the display area, a first dam surrounding the display area, a second dam outside the first dam, the second dam surrounding the first dam, a third dam between the display area and the first dam, the third dam including a first insulating layer and a second insulating layer on the first insulating layer, and a thin film encapsulation layer covering the display area, the thin film encapsulation layer including a first inorganic encapsulation layer, a second inorganic encapsulation layer, and an organic encapsulation layer between the first inorganic encapsulation layer and the second inorganic encapsulation layer. The first insulating layer of the third dam may include an extension that extends along the direction in which the first insulating layer extends, and a plurality of protrusions protruding from the extension towards the display area. The second insulating layer of the third dam may be on the extension in a form of dot patterns spaced apart from one another along a direction in which the first insulating layer extends.

The first dam and the second dam may each include the first insulating layer and the second insulating layer. The second insulating layers of the first dam and the second dam may be continuously arranged along a direction in which the first insulating layer extends.

Each of the plurality of pixels may include a first electrode, an emission layer on the first electrode, and a second electrode on the emission layer, the second electrode being arranged commonly throughout the plurality of pixels. The display apparatus may further include a pixel-defining layer covering end portions of the first electrode, a spacer on the pixel-defining layer, and a thin film transistor between each of the pixels and the substrate, the thin film transistor including an active layer, a gate electrode, a source electrode, and a drain electrode, a third insulating layer in the display area and the non-display area, the third insulating layer including at least one insulating layer arranged between the active layer, the gate electrode, the source electrode, and the drain electrode. The first insulating layer includes a same material as the pixel-defining layer. The second insulating layer includes a same material as the spacer.

The first dam and the third dam may each further include a third insulating layer between the substrate and the first insulating layer.

Heights from a surface of the substrate to an uppermost portion of the first dam and to an uppermost portion of the third dam may be equal to or greater than a height from the surface of the substrate to an uppermost portion of the second dam.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
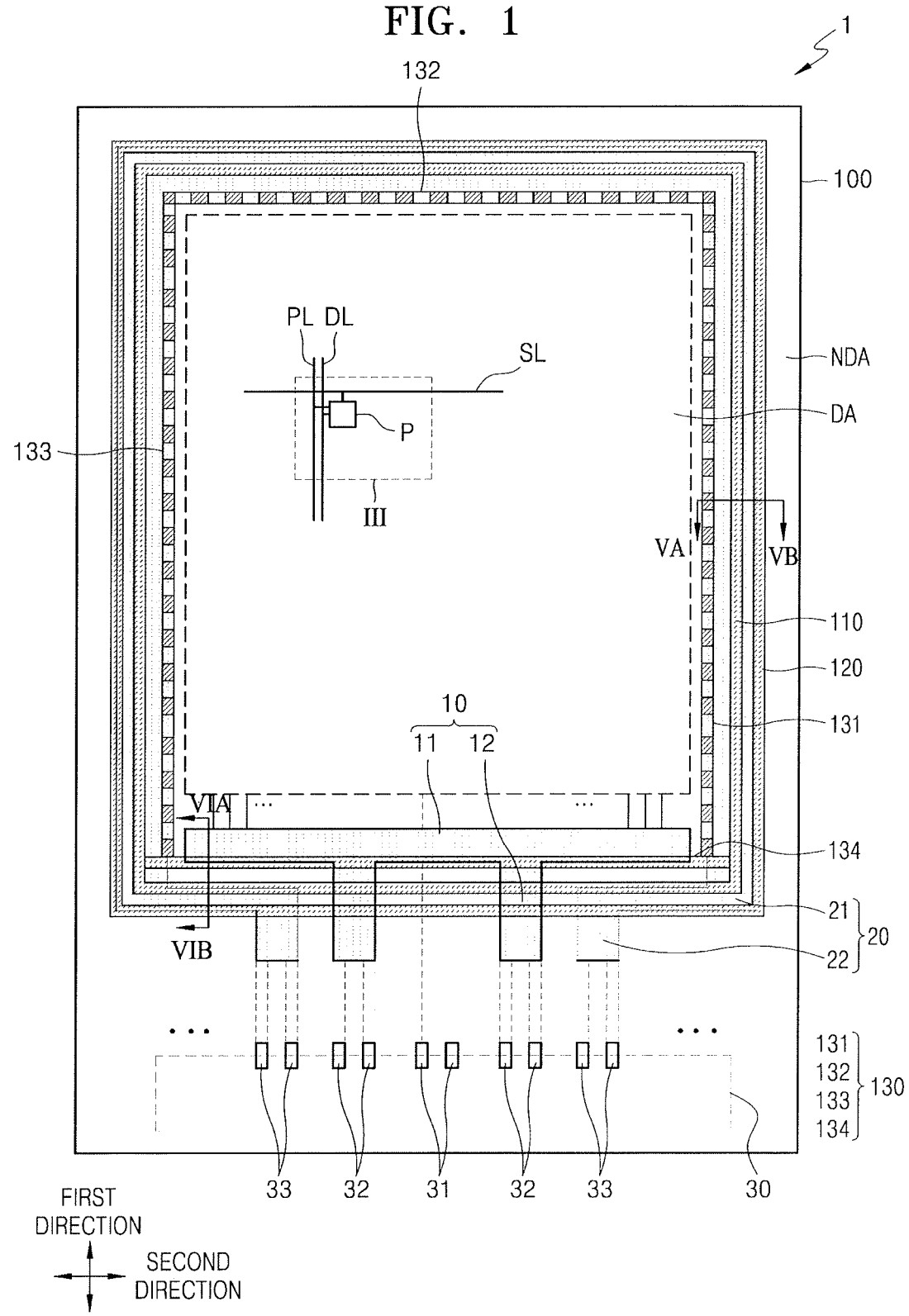
FIG. 1 illustrates a plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Expressions such as "at least one of," when preceding a list of elements, modify the entire list of elements and do not modify the individual elements of the list.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including or" "having" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added A display apparatus is an apparatus for displaying images and may include a liquid crystal display, an electrophoretic display, an organic light-emitting display, an inorganic light-emitting display, a field emission display, a surface-conduction electron-emitter display, a plasma display, a cathode ray display, etc. Hereinafter, according to an embodiment, a display apparatus that is an organic light-emitting display apparatus is described.

Figure 2A:
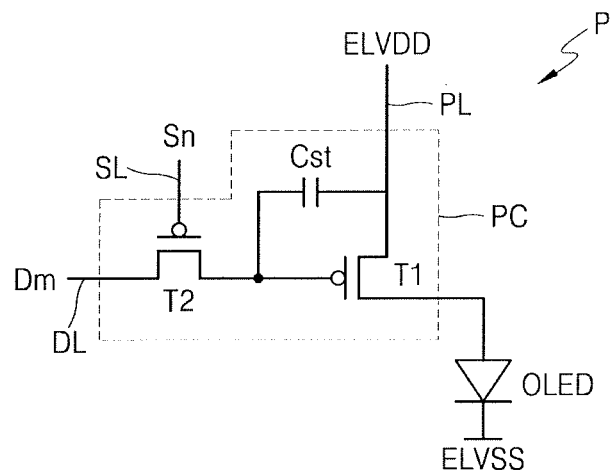
FIGS. 2A and 2B illustrate equivalent circuit diagrams of a pixel included in the display apparatus of FIG. 1.
Figure 2B:
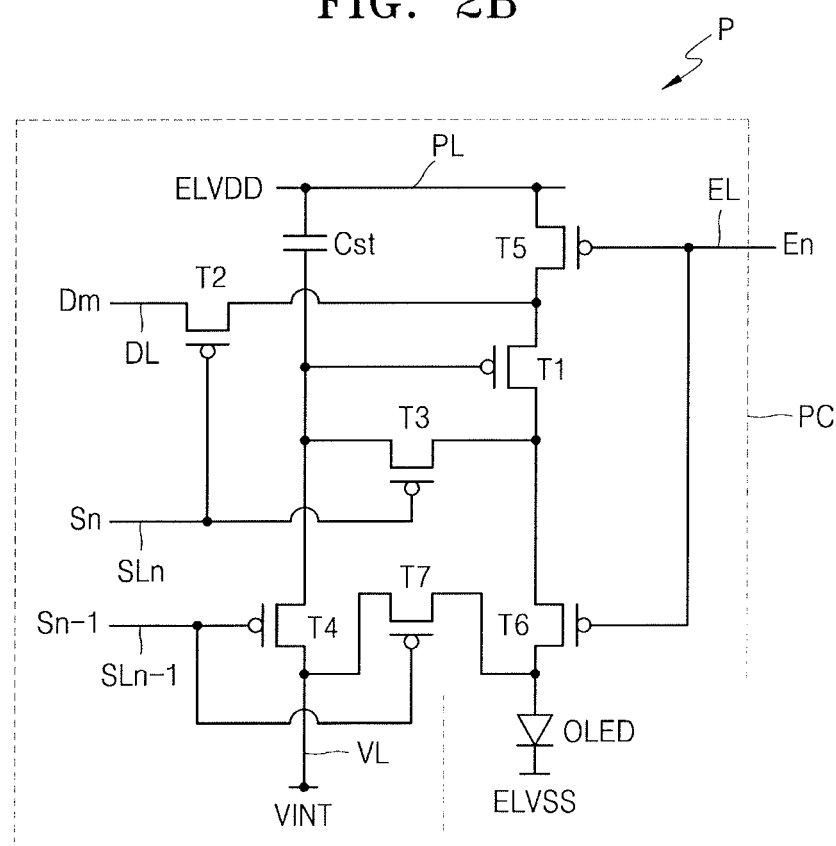
Figure 3:
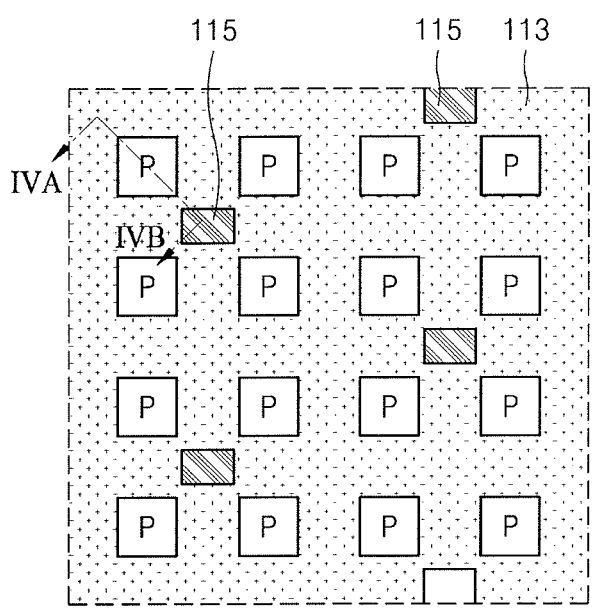
FIG. 3 illustrates a plan view of region III in FIG. 1.
Figure 4:
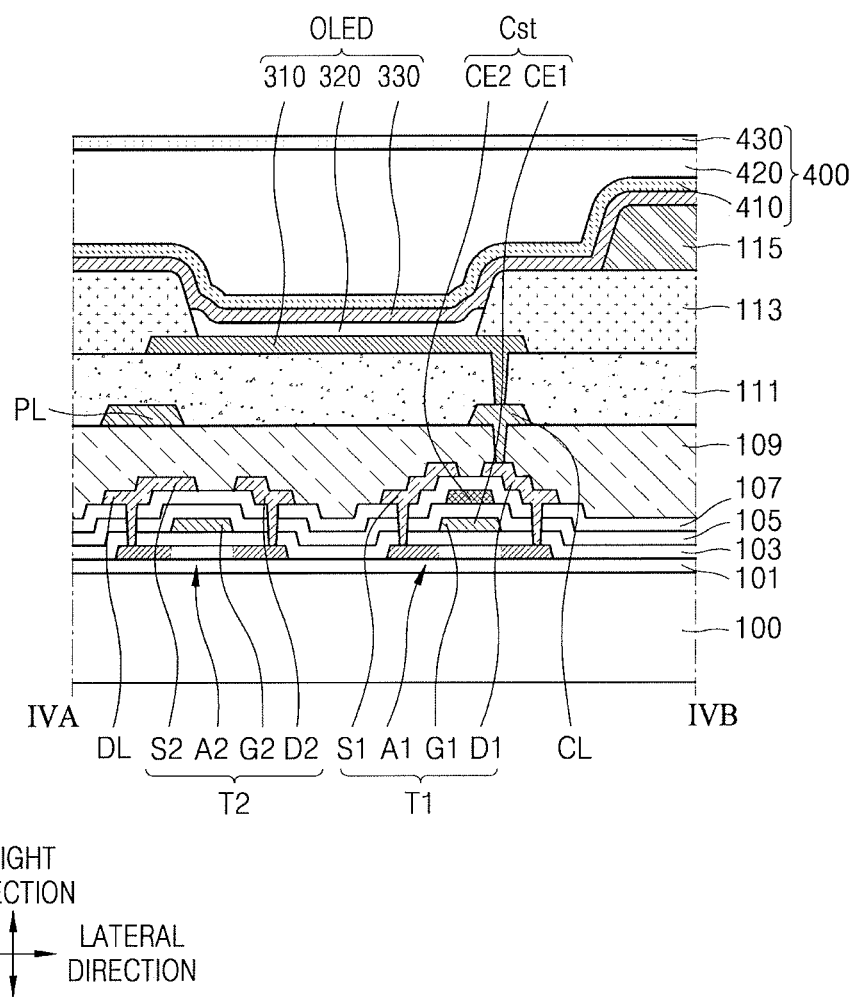
FIG. 4 illustrates a cross-sectional view of a pixel included in the display apparatus, taken along line IVA-IVB of FIG. 3.
Figure 5:
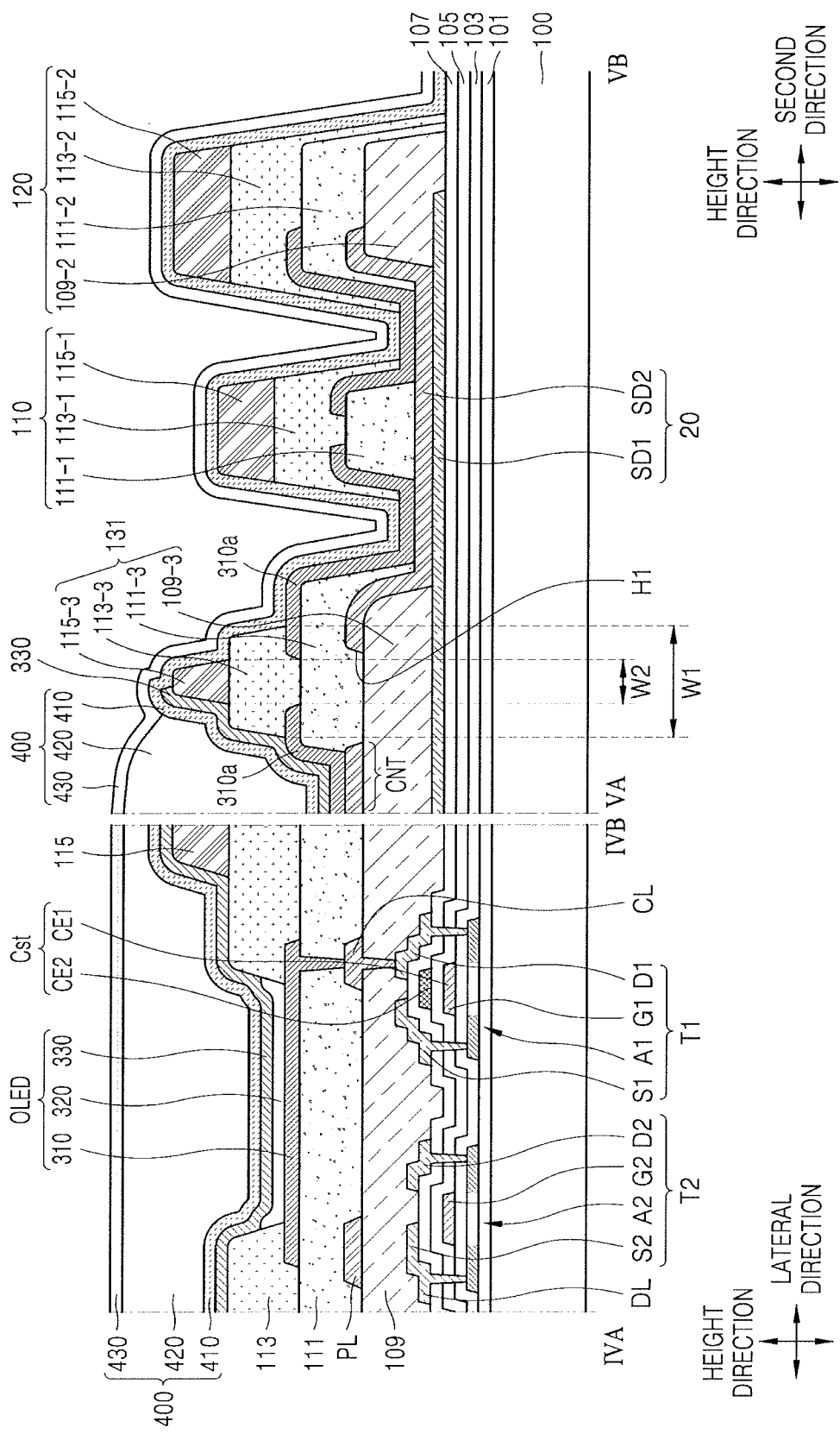
FIG. 5 illustrates a cross-sectional view taken along line VA-VB of FIG. 1.
Figure 6:
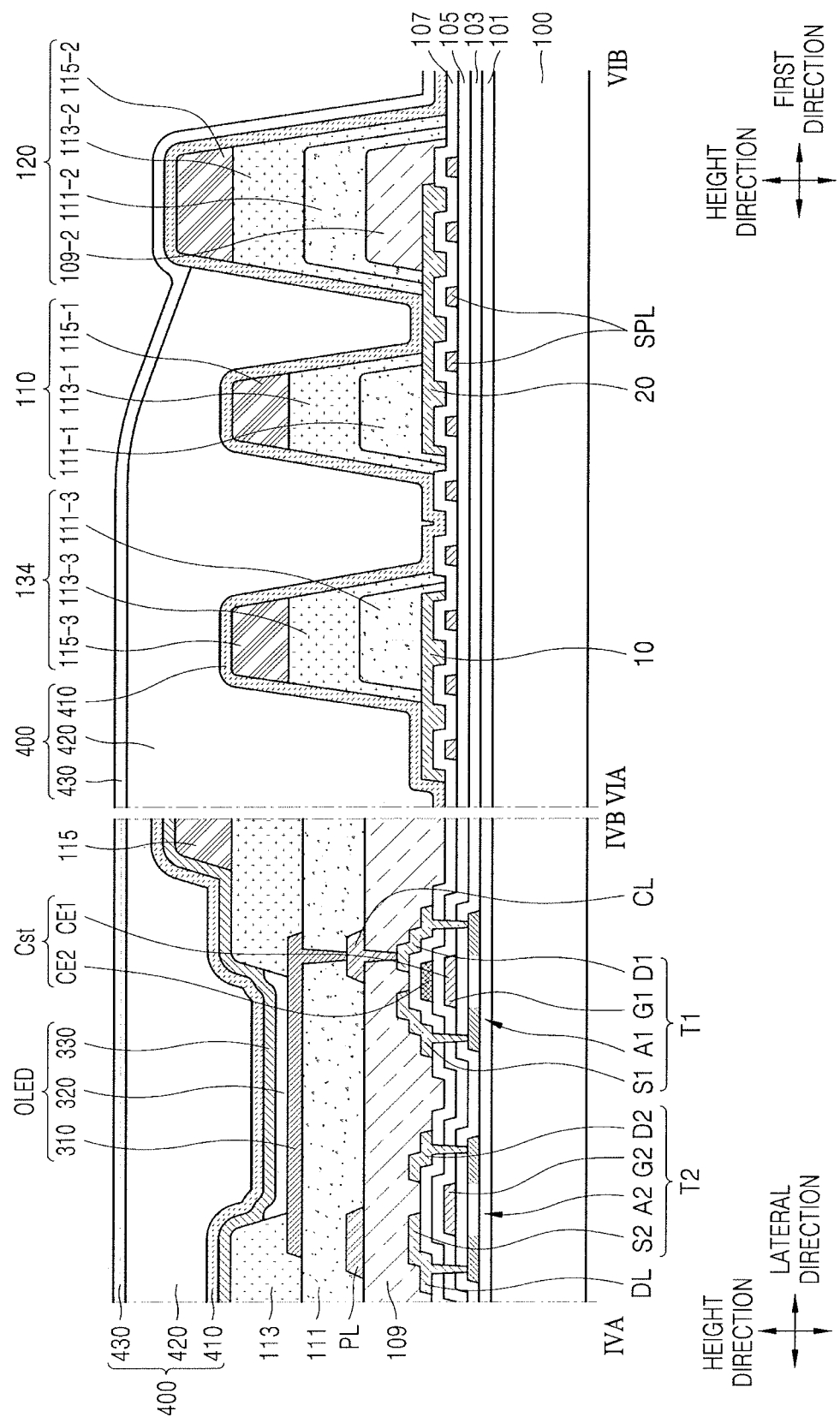
FIG. 6 illustrates a cross-sectional view taken along line VIA-VIB of FIG. 1.

FIG. 1 illustrates a plan view of a display apparatus 1 according to an embodiment, FIGS. 2A and 2B are equivalent circuit diagrams of one pixel included in the display apparatus 1 of FIG. 1, FIG. 3 illustrates a plan view of region III in FIG. 1, FIG. 4 illustrates a cross-sectional view of one pixel included in the display apparatus 1 of FIG. 1, taken along line IVA-IVB of FIG. 3, FIG. 5 illustrates a cross-sectional view taken along line VA-VB of FIG. 1, and FIG. 6 illustrates a cross-sectional view taken along line VIA-VIB of FIG. 1.

Referring to FIG. 1, the display apparatus 1 includes a display area DA on a substrate 100. The display area DA includes pixels P connected to a data line DL extending in a first direction and a scan line SL extending in a second direction intersecting with the first direction. Each of the pixels P may be connected to a driving voltage line PL extending in the first direction.

One pixel P may emit, e.g., red light, green light, blue light, or white light. For example, each pixel P may include an organic light-emitting diode. In addition, each pixel P may further include devices such as a thin film transistor, capacitor, etc.

The display area DA may provide a predetermined image using light emitted from the pixels P. A non-display area NDA may be arranged on the outside of the display area DA. For example, the non-display area NDA may surround the display area DA.

The non-display area NDA, in which pixels P are not arranged, does not provide images. In the non-display area NDA, a first power voltage line 10 and a second power voltage line 20 may be arranged. The second power voltage line 20 may supply a voltage that is different from that of the first power voltage line 10.

The first power voltage line 10 may include a first main voltage line 11 and a first connecting line 12 arranged at a side of the display area DA. For example, when the display area DA has a rectangular shape, the first main voltage line 11 may be arranged to correspond to one of sides of the display area DA. The first connecting line 12 may extend from the first main voltage line 11 in the first direction. The first direction may be understood as a direction from the display area DA towards a terminal portion 30 located around an end portion of the substrate 100. The first connecting line 12 may be connected to a first terminal 31 of the terminal portion 30.

The second power voltage line 20 may include a second main voltage line 21 partially surrounding opposite ends of the first main voltage line 11 and the display area DA, and a second connecting line 22 extending from the second main voltage line 21 in the first direction. For example, when the display area DA has a rectangular shape, the second main voltage line 21 may extend along the opposite ends of the first main voltage line 11 and other sides of the display area DA than one side adjacent to the first main voltage line 11. The second connecting line 22 may extend along the first direction in parallel with the first connecting line 12 and may be connected to a second terminal 32 of the terminal portion 30. The second power voltage line 20 may be bent to surround ends of the first power voltage line 10.

The terminal portion 30 may be arranged at an end portion of the substrate 100. The terminal portion 30 may include a plurality of terminals, e.g., first to third terminals, 31, 32, and 33. The terminal portion 30 may not be covered by an insulating layer but may be exposed. The terminal portion 30 may be electrically connected to a controller such as a flexible printed circuit board, an operation driver integrated circuit (IC) chip, etc.

The controller may convert a plurality of image signals input from outside to a plurality of image data signals and transfer the plurality of image data signals to the display area DA via the third terminal 33. The controller may generate control signals for controlling operations of first and second gate drivers after receiving a vertical synchronization signal, a horizontal synchronization signal, and a clock signal, and then may transfer the control signals to the first and second gate drivers via terminals.

The controller may transfer different voltages from each other respectively to the first power voltage line 10 and the second power voltage line 20 via the second terminal 32 and the third terminal 33.

The first power voltage line 10 may provide each pixel P with a first power voltage ELVDD (see FIGS. 2A and 2B), and the second power voltage line 20 may provide each pixel P with a second power voltage ELVSS (see FIGS. 2A and 2B).

For example, the first power voltage ELVDD may be provided to each pixel P via the driving voltage line PL that is connected to the first power voltage line 10. The second power voltage ELVSS may be provided to a cathode of an organic light-emitting device OLED (see FIGS. 2A and 2B) included in each pixel P. The second main voltage line 21 of the second power voltage line 20 may be connected to the cathode of the organic light-emitting device OLED in the non-display area NDA.

A scan driver providing a scan signal to the scan line SL of each pixel P, a data driver providing a data signal to the data line DL of each pixel P, etc. may be further arranged in the non-display area NDA.

In the non-display area NDA, a first dam 110, a second dam 120, and a third dam 130, which surround the display area DA, may be spaced from one another.

The first dam 110 and the second dam 120 function as dams that prevent an organic material from flowing towards edges of the substrate 100 when an organic encapsulation layer 420 (see FIG. 4) including the organic material such as a monomer that is also included in the thin film encapsulation layer 400 (see FIG. 4) is formed by an inkjet process. The first dam 110 and the second dam 120 may prevent the generation of an edge tail at the edges of the substrate 100 due to flow of the organic encapsulation layer 420.

Even with the first and second dams 110 and 120, the organic encapsulation layer 420 could flow towards the edges of the substrate 100 beyond the first and second dams 110 and 120. For example, if the second dam 120 were to be arranged closer to the first dam 110 than to the edge of the substrate 100 in order to reduce an area of a dead space that is visible from the outside, or if the first dam 110 were to be arranged closer to the second dam 120 in order to expand the display area DA, a distance between the first dam 110 and the second dam 120 would be reduced and the organic encapsulation layer 420 could overflow beyond the second dam 120. The edge tail generated due to the overflow of the organic material could become an infiltration path through which external impurities could be introduced and could cause defects of the organic light-emitting device OLED. As described above, when the dead space is reduced, it becomes more desirable to reduce overflow of the organic material and to control an overflow amount of the organic material.

According to the embodiment, the third dam 130 is provided between the display area DA and the first dam 110 to reduce a reflow velocity of the organic material. Accordingly, an amount of the organic material flowing over the first dam 110 may be reduced. In addition, an overflowed organic material that flows towards the first dam 110 beyond the third dam 130 may be redirected back to the display area DA. Thus, the amount and location of organic material may be controlled.

In the embodiment, the third dam 130 may include a first portion 131 extending in the first direction along a side of the substrate 100, a second portion 132 connected to the first portion 131 and extending in the second direction of the substrate 100, a third portion 133 connected to the second portion 132 and extending in the first direction of the substrate 100, and a fourth portion 134 connected to the third portion 133 and extending in the second direction of the substrate 100. The third dam 130 will be described in more detail below.

Referring to FIG. 2A, the pixel P may include a pixel circuit PC connected to the scan line SL and the data line DL and an organic light-emitting diode OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL and may transfer a data signal Dm input through the data line DL to the driving thin film transistor T1 according to a scan signal Sn input through the scan line SL.

The storage capacitor Cst may be connected to the switching thin film transistor T2 and a driving voltage line PL and may store a voltage corresponding to a difference between a voltage transferred from the switching thin film transistor T2 and the first power voltage ELVDD (or driving voltage) supplied to the driving voltage line PL.

The driving thin film transistor T1 may be connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a predetermined luminance according to the driving current.

FIG. 2A shows an example in which the pixel circuit PC includes two thin film transistors and one storage capacitor. In some implementations, the pixel circuit may include a different number of thin film transistors and storage capacitor.

Referring to FIG. 2B, the pixel circuit PC may include the driving and switching thin film transistors T1 and T2, a compensating thin film transistor T3, a first initialization thin film transistor T4, a first emission control thin film transistor T5, a second emission control thin film transistor T6, and a second initialization thin film transistor T7.

In FIG. 2B, every pixel P may include signal lines SLn, SLn-1, EL, DL, an initialization voltage line VL, and the driving voltage line PL. In some implementations, at least one of the signal lines SLn, SLn-1, EL, and DL, and/or the initialization voltage line VL may be shared by neighboring pixels.

A drain electrode of the driving thin film transistor T1 may be electrically connected to the organic light-emitting diode OLED via the second emission control thin film transistor T6. The driving thin film transistor T1 may receive the data signal Dm according to a switching operation of the switching thin film transistor T2 to supply a driving current to the organic light-emitting diode OLED.

A gate electrode of the switching thin film transistor T2 may be connected to the first scan line SLn, and a source electrode of the switching thin film transistor T2 may be connected to the data line DL. A drain electrode of the switching thin film transistor T2 may be connected to a source electrode of the driving thin film transistor T1, and at the same time, may be connected to the driving voltage line PL via the first emission control thin film transistor T5.

The switching TFT T2 may be turned on according to the scan signal Sn received through the first scan line SLn and may perform a switching operation that transfers the data signal Dm transferred through the data line DL to the source electrode of the driving thin film transistor T1.

A gate electrode of the compensating thin film transistor T3 may be connected to the first scan line SLn. A source electrode of the compensating thin film transistor T3 may be connected to the drain electrode of the driving thin film transistor T1, and at the same time, may be connected to a pixel electrode of the organic light-emitting diode OLED via the second emission control thin film transistor T6. A drain electrode of the compensating thin film transistor T3 may be connected to one electrode of the storage capacitor Cst, together with the source electrode of the first initialization thin film transistor T4 and the gate electrode of the driving thin film transistor T1. The compensating thin film transistor T3 may be turned on according to the first scan signal Sn transferred through the first scan line SLn. The compensating thin film transistor T3 may connect the gate electrode and the drain electrode of the driving thin film transistor T1 to each other for diode-connecting the driving thin film transistor T1.

The gate electrode of the first initialization thin film transistor T4 may be connected to a second scan line SLn-1 (previous scan line). The drain electrode of the first initialization thin film transistor T4 may be connected to an initialization voltage line VL. A source electrode of the first initialization thin film transistor T4 may be connected to one electrode of the storage capacitor Cst, together with the drain electrode of the compensating thin film transistor T3 and the gate electrode of the driving thin film transistor T1. The first initialization TFT T4 may be turned on according to a second scan signal Sn-1 transferred through the second scan line SL-1 to transfer an initialization voltage Vint to the gate electrode of the driving thin film transistor T1 and to perform an initialization operation for initializing a voltage at the gate electrode of the driving thin film transistor T1.

A gate electrode of the first emission control thin film transistor 15 may be connected to an emission control line EL. A source electrode of the first emission control thin film transistor T5 may be connected to the driving voltage line PL. A drain electrode of the first emission control thin film transistor 15 may be connected to the source electrode of the driving thin film transistor T1 and the drain electrode of the switching thin film transistor T2.

A gate electrode of the second emission control thin film transistor T6 may be connected to the emission control line EL. A source electrode of the second emission control thin film transistor T6 may be connected to the drain electrode of the driving thin film transistor T1 and the source electrode of the compensating thin film transistor T3. A drain electrode of the second emission control thin film transistor 16 may be electrically connected to the pixel electrode of the organic light-emitting diode OLED. The first emission control thin film transistor T5 and the second emission control thin film transistor T6 may be simultaneously turned on according to an emission control signal En transferred through the emission control line EL to transfer the first power voltage ELVDD to the organic light-emitting diode OLED so that a driving current may flow through the organic light-emitting diode OLED.

A gate electrode of the second initialization thin film transistor T7 may be connected to the second scan line SLn-1. A source electrode of the second initialization thin film transistor T7 may be connected to the pixel electrode of the organic light-emitting diode OLED. A drain electrode of the second initialization thin film transistor 17 may be connected to the initialization voltage line VL. The second initialization thin film transistor T7 may be turned on according to the second scan signal Sn-1 transferred through the second scan line SLn-1 to initialize the pixel electrode of the organic light-emitting diode OLED.

FIG. 2B shows an example in which the first initialization thin film transistor T4 and the second initialization thin film transistor T7 are connected to the second scan line SLn-1. In some implementations, the first initialization thin film transistor T4 may be connected to the second scan line SLn-1, for example, the previous scan line, to be driven according to the second scan signal Sn-1, and the second initialization thin film transistor T7 may be connected to a separate signal line (e.g., a post scan line) to be driven according to a signal transferred to the corresponding scan line.

Another electrode of the storage capacitor Cst may be connected to the driving voltage line PL. One electrode of the storage capacitor Cst may be connected to the gate electrode of the driving thin film transistor T1, the drain electrode of the compensating thin film transistor T3, and the source electrode of the first initialization thin film transistor 14.

An opposite electrode (e.g., cathode) of the organic light-emitting diode OLED may be provided with the second power voltage ELVSS (or a common power voltage). The organic light-emitting diode OLED may emit light after receiving a driving current from the driving thin film transistor T1.

According to some implementations, the number and the circuit design transistors and the storage capacitor illustrated with reference may vary.

Referring to FIGS. 3 and 4, the region III of FIG. 1 and the driving and switching thin film transistors T1 and T2 and the storage capacitor Cst of the pixel circuit PC in each pixel P illustrated above with reference to FIGS. 2A and 2B will be described in more detail below.

Referring to FIG. 3, the plurality of pixels P may be arranged in the region III of FIG. 1. The plurality of pixels P may be surrounded by a pixel-defining layer 113. A spacer 115 may be arranged on the pixel-defining layer 113.

In FIG. 3, the pixels P may have square shapes of the same sizes or may have different sizes and different shapes.

The spacer 115 may be provided between some of the plurality of pixels P. The spacer 115 may maintain a gap between a mask and the substrate 100 during a process of providing an intermediate layer 320 including an emission layer by using the mask. Thus, defects such as dents or torn portions of the intermediate layer 320 that could be caused by the presence of the mask may be prevented during a deposition process.

The spacer 115 may include the same material as that of the pixel-defining layer 113. The spacer 115 may be formed to have a different height from the pixel-defining layer 113 and may be formed to have a same material as that of the pixel-defining layer 113 by using a half-tone mask simultaneously when the pixel-defining layer 113 is formed.

Referring to FIG. 4, a buffer layer 101 may be on the substrate 100. The driving thin film transistor T1, the switching thin film transistor T2, and the storage capacitor Cst may be arranged on the buffer layer 101.

The substrate 100 may include suitable materials such as glass, metal, plastic, etc. For example, the substrate 100 may include a flexible substrate including a polymer resin such as a polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc.

The buffer layer 101 on the substrate 100 may include silicon oxide (SiOx) and/or silicon nitride (SiNx) for preventing impurities from infiltrating to the substrate 100.

The driving thin film transistor T1 may include a driving semiconductor layer A1 and a driving gate electrode G1. The switching thin film transistor T2 may include a switching semiconductor layer A2 and a switching gate electrode G2. A first gate insulating layer 103 may be arranged between the driving semiconductor layer A1 and the driving gate electrode G1 and between the switching semiconductor layer A2 and the switching gate electrode G2. The first gate insulating layer 103 may include an inorganic insulating material such as SiOx, SiNx, silicon oxynitride (SiON), etc.

The driving semiconductor layer A1 and the switching semiconductor layer A2 may include amorphous silicon or polycrystalline silicon. In some implementations, the driving semiconductor layer A1 and the switching semiconductor layer A2 may each include an oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The driving semiconductor layer A1 may be disposed apart from the switching semiconductor layer A2 in the lateral direction. The lateral direction may be any direction between the first direction and the second direction.

The driving semiconductor layer A1 may include a driving channel region that overlaps the driving gate electrode G1 in the height direction and that is not doped with impurities. A driving source region and a driving drain region doped with impurities may be on opposite sides of the driving channel region. A driving source electrode S1 and a driving drain electrode D1 may be respectively connected to the driving source region and the driving drain region.

The switching semiconductor layer A2 may include a switching channel region that overlaps the switching gate electrode G2 in the height direction and that is not doped with impurities. A switching source region and a switching drain region doped with the impurities may be at opposite sides of the switching channel region. A switching source electrode S2 and a switching drain electrode D2 may be respectively connected to the switching source region and the switching drain region.

The driving gate electrode G1 and the switching gate electrode G2 may include Mo, Al, Cu, Ti, etc. The driving gate electrode G1 may each have a single-layered structure or a multi-layered structure.

In some embodiments, the storage capacitor Cst may overlap the driving thin film transistor T1 in the height direction. In this case, the storage capacitor Cst and the driving thin film transistor T1 may each have an increased area and may provide high-quality images. For example, the driving gate electrode G1 may be a first storage capacitor plate CE1 of the storage capacitor Cst. A second storage capacitor plate CE2 may overlap the first storage capacitor plate CE1 in the height direction a second gate insulating layer 105 interposed therebetween. The second gate insulating layer 105 may include an inorganic insulating material such as SiOx, SiNx. SiON, etc.

The driving thin film transistor T1, the switching thin film transistor T2, and the storage capacitor Cst may be covered by an interlayer insulating layer 107.

The interlayer insulating layer 107 may include an inorganic material such as SiON, SiOx, and/or SiNx.

The data line DL may be arranged on the interlayer insulating layer 107. The data line DL may be connected to the switching semiconductor layer A2 of the switching thin film transistor T2 via a contact hole that penetrates through the interlayer insulating layer 107. The data line DL may function as the switching source electrode S2.

The driving source electrode S1, the driving drain, electrode D1, the switching source electrode S2, and the switching drain electrode D2 may be arranged on the interlayer insulating layer 107 and may be connected to the driving semiconductor layer A1 or the switching semiconductor layer A2 via the contact holes penetrating through the interlayer insulating layer 107.

In addition, the data line DL, the driving source electrode S1, the driving drain electrode D1, the switching source electrode S2, and the switching drain electrode D2 may be covered by an inorganic protective layer.

The inorganic protective layer may have a single-layered or multi-layered structure including SiNx and SiOx. The inorganic protective layer may prevent some exposed wirings in the non-display area NDA, for example, wirings formed with the data line DL through the same process, from being damaged due to an etchant that is used in patterning of a pixel electrode 310.

The driving voltage line PL may be arranged at a different layer from that of the data line DL. Throughout the specification, the phrase 'A and B are arranged at different layers' refers to a case in which at least one insulating layer is provided between A and B, for example, where one of A and B is arranged under the at least one insulating layer and the other is arranged on the at least one insulating layer. A first planarization layer 109 may be provided between the driving voltage line PL and the data line DL. The driving voltage line PL may be covered by a second planarization layer 111.

The driving voltage line PL may have a single-layered structure or a multi-layered structure including at least one selected from Al, Cu, Ti, and an alloy thereof. In an embodiment, the driving voltage line PL may have a triple-layered structure including Ti/Al/Ti.

FIG. 4 shows an example in which the driving voltage line PL is arranged on the first planarization layer 109. In some implementations, the driving voltage line PL may be connected to a lower additional voltage line arranged at the same layer as that of the data line DL via a contact hole provided in the first planarization layer 109 to reduce resistance.

The first planarization layer 109 and the second planarization layer 111 may have a single-layered structure or a multi-layered structure.

The first planarization layer 109 and the second planarization layer 111 may include an organic insulating material. For example, the organic insulating material may include a general universal polymer (polymethylmethacrylate (PMMA) or polystyrene (PS)), a polymer derivative having one or more phenol groups, an acryl-based polymer, an imide-based polymer, an aryl ether-based polymer, an amide-based polymer, a fluoride-based polymer, a p-xylene-based polymer, a vinyl alcohol-based polymer, etc.

In some implementations, the first planarization layer 109 and the second planarization layer 111 may include an inorganic insulating material. For example, the inorganic insulating material may include SiON, SiOx, SiNx, etc.

The organic light-emitting diode OLED including the pixel electrode 310, an opposite electrode 330, and an intermediate layer 320 including an emission layer between the pixel electrode 310 and the opposite electrode 330 may be located on the second planarization layer 111.

The pixel electrode 310 may be connected to a connecting line CL on the first planarization layer 109. The connecting line CL may be connected to the driving drain electrode D1 of the driving thin film transistor T1.

The pixel electrode 310 may be a transparent electrode or a reflective electrode.

When the pixel electrode 310 is a transparent electrode, the pixel electrode 310 may include a transparent conductive layer. The transparent conductive layer may include at least one selected from indium tin oxide (ITO), indium zinc oxide (IZO), zinc oxide (ZnO), indium oxide ($In_2O_3$), indium gallium oxide, and aluminum zinc oxide (AZO). In this case, the pixel electrode 310 may further include a semi-transmissive layer, in addition to the transparent conductive layer, for improving a light efficiency. The semi-transmissive layer may include at least one selected from Ag, Mg, Al, Pt, Pd, Au, Ni, Nd, Ir, Cr, Li, Ca, and Yb formed as a thin film of a few to tens of micrometers μm).

When the pixel electrode 310 is a reflective electrode, the pixel electrode 310 may include a reflective layer including Ag, Mg, Al, Pt, Pd, Au, Ni, Nd, Ir, Cr, or a combination thereof, and a transparent conductive layer arranged under and/or on the reflective layer. The transparent conductive layer may include at least one selected from the group consisting of ITO, IZO, ZnO, $In_2O_3$, and AZO.

According to embodiments, the pixel electrode 310 may include various materials and may have various structures, e.g., a single-layered structure or a multi-layered structure.

The pixel-defining layer 113 may be arranged on the pixel electrode 310.

The pixel-defining layer 113 may have openings each exposing the pixel electrode 310 to define the pixels P. The pixel-defining layer 113 may increase a distance between edges of the pixel electrode 310 and the opposite electrode 330 to prevent generation of an arc at an end portion of the pixel electrode 310. The pixel-defining layer 113 may include, for example, an organic material such as polyimide, hexamethyldisiloxane (HMDSO), etc.

The intermediate layer 320 may include a low-molecular weight organic material or a polymer material.

When the intermediate layer 320 includes the low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure. The intermediate layer 320 may include various organic materials, e.g., copper phthalocyanine (CuPc), N,N'-di(naphthalene-1-yl)-N,N'-diphenyl-benzidine (NPB), and tris-8-hydroxyquinoline aluminum ($Alq_3$). The intermediate layer 320 may be formed by a suitable method, e.g., a vacuum deposition method.

When the intermediate layer 320 includes a polymer material, the intermediate layer 320 may have a structure including an HTL and the emission layer. The HTL may include poly(3,4-ethylenedioxythiophene) PEDOT, and the EML may include a poly-phenylenevinylene (PPV)-based or polyfluorene-based polymer material. The intermediate layer 320 may be provided by using a screen printing method, an inkjet printing method, a laser induced thermal imaging (LITI) method, etc.

The intermediate layer 320 may be formed integrally throughout the plurality of pixel electrodes 310 or may be patterned to correspond to each of the plurality of pixel electrodes 310.

The opposite electrode 330 may be provided above the display area DA and may cover the display area DA. The opposite electrode 330 may be integrally provided throughout the plurality of organic light-emitting diodes OLED to correspond to the plurality of pixel electrodes 310. The opposite electrode 330 may be electrically connected to a second power voltage line 20 that will be described below.

The opposite electrode 330 may be a transparent electrode or a reflective electrode. When the opposite electrode 330 is a transparent electrode, the opposite electrode 330 may include at least one selected from Ag, Al, Mg, Li, Ca, Cu, LiF/Ca, MgAg, and CaAg and may have a thin film type of a thickness of a few to tens of micrometers (μm).

When the opposite electrode 330 is a reflective electrode, the opposite electrode may include at least one selected from Ag, Al, Mg, Li, Ca, Cu, LiF/Ca, LiF/Al, MgAg, and CaAg. Various modifications may be made to the structure and material included in the opposite electrode 330.

A spacer 115 may be arranged on the pixel-defining layer 113. The spacer 115 may protrude from the pixel-defining layer 113 towards an encapsulation portion 400. The spacer 115 may maintain a space between a mask and the substrate 100 during a process of forming the intermediate layer 320 including the emission layer using the mask. The spacer 115 may prevent the generation of defects such as denting or tearing of the intermediate layer 320 that could be caused by the use of the mask during the deposition process.

The spacer 115 may include an organic material such as polyimide, HMDSO, etc. The spacer 115 may be arranged on the first to third dams s 110, 120, and 130 that will be described below, in order to prevent moisture infiltration and to in order to form steps of the dams.

The organic light-emitting diode OLED may be easily susceptible to damage by external moisture or oxygen. Accordingly, the organic light-emitting diode OLED may be covered and protected by a thin film encapsulation layer 400.

The thin film encapsulation layer 400 may cover the display area DA and may extend to the outside of the display area DA. The thin film encapsulation layer 400 may include at least one organic encapsulation layer and at least one inorganic encapsulation layer. In one embodiment, the thin film encapsulation layer 400 may include a first inorganic encapsulation layer 410, an organic encapsulation layer 420, and a second inorganic encapsulation layer 430.

The first inorganic encapsulation layer 410 may entirely cover the opposite electrode 330. The first inorganic encapsulation layer 410 may include SiOx, SiNx, and/or SiON.

If desired, other layers such as a capping layer may be provided between the first inorganic encapsulation layer 410 and the opposite electrode 330. For example, the capping layer may include one or more organic materials or inorganic materials selected from $SiO_2$, SiNx, $ZnO_2$, TiOx, $ZrO_2$, ITO, IZO, $Alq_3$, CuPc, CBP, a-NPB, and $ZiO_2$, in order to improve an optical efficiency. In some implementations, the capping layer may allow the light produced by the organic light-emitting diode OLED to generate a plasmon resonance phenomenon. For example, the capping layer may include nano-particles. The capping layer may prevent the organic light-emitting diode OLED from being damaged due to heat or plasma generated during a chemical vapor deposition process or a sputtering process for forming the thin film encapsulation layer 400. For example, the capping layer may include an epoxy-based material including at least one selected from a bisphenol typed epoxy resin, an epoxidized butadiene resin, a fluorine typed epoxy resin, and a novolac epoxy resin.

A layer including LiF, etc. may be provided between the first inorganic encapsulation layer 410 and the capping layer if desired.

The first inorganic encapsulation layer 410 may be formed along a structure thereunder. Accordingly, the first inorganic encapsulation layer 410 may have an uneven upper surface. The organic encapsulation layer 420 may cover and planarize the first inorganic encapsulation layer 410. The organic encapsulation layer 420 may planarize the upper surface of a portion corresponding to the display area DA.

The organic encapsulation layer 420 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, etc.), or a combination thereof.

The second inorganic encapsulation layer 430 may cover the organic encapsulation layer 420. The second inorganic encapsulation layer 430 may include SiOx, SiNx, and/or SiON. A second inorganic encapsulation layer 430 may be deposited at an edge area of a display apparatus 1 to directly contact a first inorganic encapsulation layer 410 so that an organic encapsulation layer 420 is not exposed to an outer portion of the display apparatus (see FIG. 5).

Referring to FIG. 5, a left portion of the drawing shows a structure of the pixel P of FIG. 4, and a right portion of the drawing shows a cross-section taken along a line VA-VB of FIG. 1.

In the cross-section taken along the line VA-VB, the buffer layer 101, the first gate insulating layer 103, the second gate insulating layer 105, and the interlayer insulating layer 107 are arranged on the substrate 100, and a first conductive layer SD1 and a second conductive layer SD2 are arranged on the interlayer insulating layer 107.

The first conductive layer SD1 may include the same material as that of the data line DL. The second conductive layer SD2 may include the same material as that of the driving voltage line PL. The first conductive layer SD1 may extend towards the end portion of the substrate 100 after passing through a boundary of a hole H1 formed in the first planarization layer 109 to be connected to the second conductive layer SD2. The second conductive layer SD2 may be partially in contact with a connecting layer 310a including the same material as that of the pixel electrode 310 and the opposite electrode 330 extending from the display area DA at a connecting portion CNT. The first conductive layer SD1 and the second conductive layer SD2 may form the first power voltage line 10 supplying the first power voltage ELVDD to each pixel P.

The first portion 131 of the third dam 130 may be arranged at a location that partially overlaps the first power voltage line 10 in the height direction. The first dam 110 and the second dam 120 may be sequentially arranged from the first portion 131 of the third dam 130 towards the end portion of the substrate 100.

The first portion 131 of the third dam 130 (see FIG. 11) may include a first layer 109-3 including the same material as that of the first planarization layer 109, a second layer 111-3 including the same material as that of the second planarization layer 111, a third layer 113-3 including the same material as that of the pixel-defining layer 113, and a fourth layer 115-3 including the same material as that of the spacer 115.

The first dam 110 may include a first layer 111-1 including the same material as that of the second planarization layer 111, a second layer 113-1 including the same material as that of the pixel-defining layer 113, and a third layer 115-1 including the same material as that of the spacer 115.

The second dam 120 may include a first layer 109-2 including the same material as that of the first planarization layer 109, a second layer 111-2 including the same material as that of the second planarization layer 111, a third layer 113-2 including the same material as that of the pixel-defining layer 113, and a fourth layer 115-2 including the same material as that of the spacer 115.

In the first portion 131 of the third dam 130, the third layer 113-3 may extend in the first direction and the fourth layer 115-3, for example, the uppermost layer in a height direction may be arranged as dot patterns spaced from one another in the first direction.

Figure 7A:
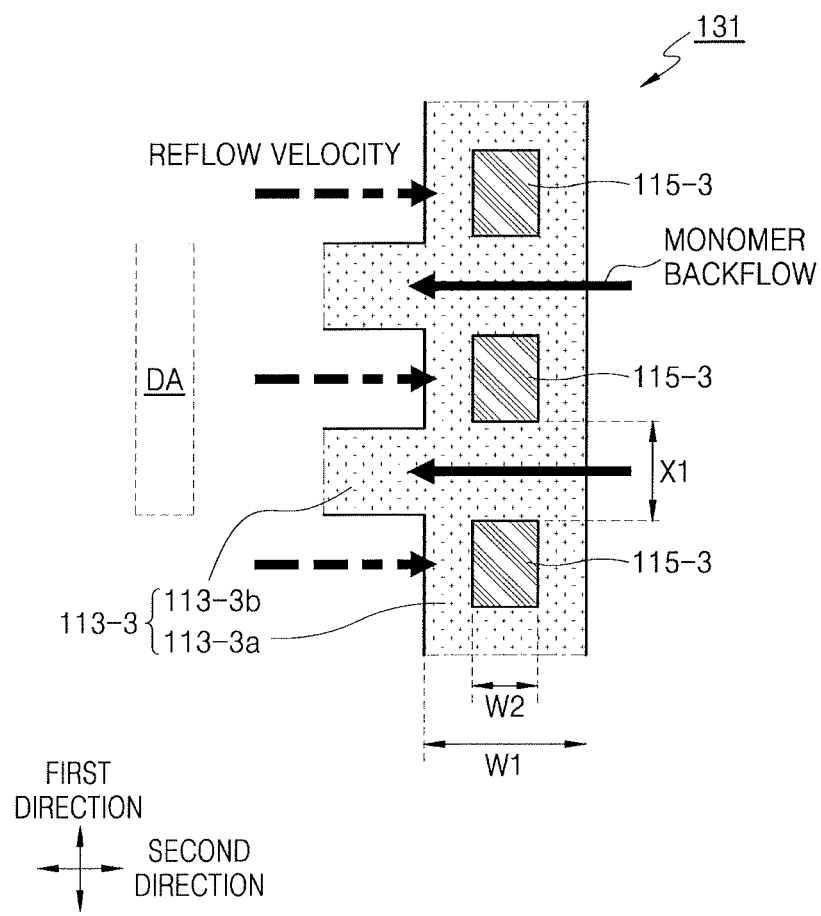
FIG. 7A illustrates a plan view of a first portion of a third dam.
Figure 7B:
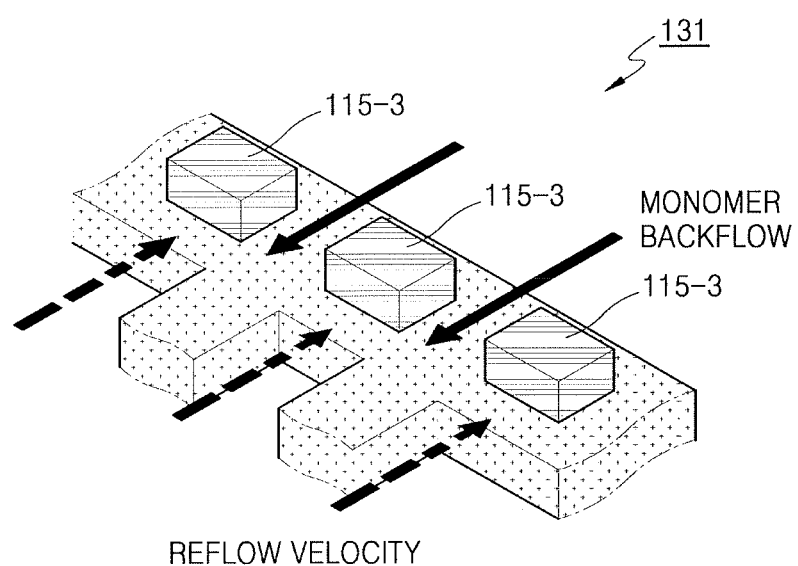
FIG. 7B illustrates a perspective view of the first portion of FIG. 7A.

Referring to FIGS. 7A and 7B, structures of the third and fourth layers 113-3 and 115-3 in the first portion 131 of the third dam 130 will be described in detail below.

The third layer 113-3 may include an extension 113-3a extending in a direction and a plurality of protrusions 113-3b protruding from the extension 113-3a towards the display area DA. The protrusions 113-3b of the third layer 113-3 may form concavo-convex patterns to reduce a velocity of a flow of organic material, for example, organic material that may flow when an organic encapsulation member 420 is formed.

The fourth layer 115-3 may be arranged on the extension 113-3a of the third layer 113-3 with a predetermined distance X1. The fourth layer 115-3 spaced above the extension 113-3a may be formed as dot patterns. While patterning the fourth layer 115-3 as the dot patterns, a width W2 of the fourth layer 115-3 may be less than a width W1 of the extension 113-3a of the third layer 113-3.

The fourth layer 115-3 may entirely increase a height of the third dam 130. Accordingly, a reflow velocity of an organic layer such as a monomer proceeding from the display area DA towards the end portion of the substrate 100 may be reduced around the dot patterns. Also, at a region where the fourth layer 115-3 is spaced by the predetermined distance X1, an overflowed organic material that moves towards the first dam 110 may be forced to flow back to the display area DA. Therefore, an amount of the organic material flowing towards the first dam 110 and a backflow of the organic material may the amount of the organic material to be controlled.

Figure 8:
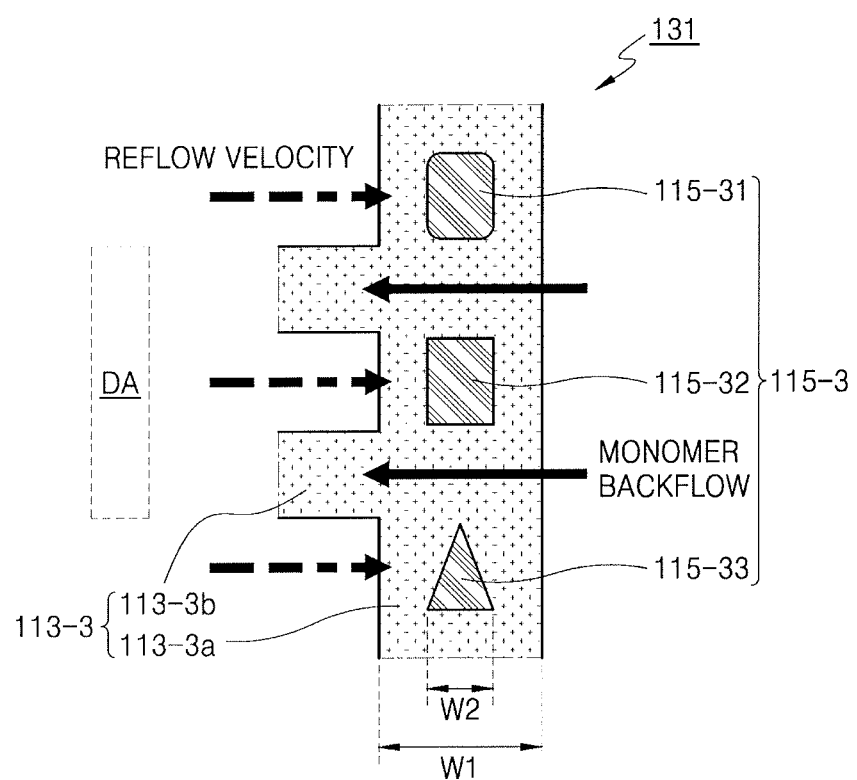
FIG. 8 illustrates a plan view showing another example of the first portion in the third dam.
Figure 9:
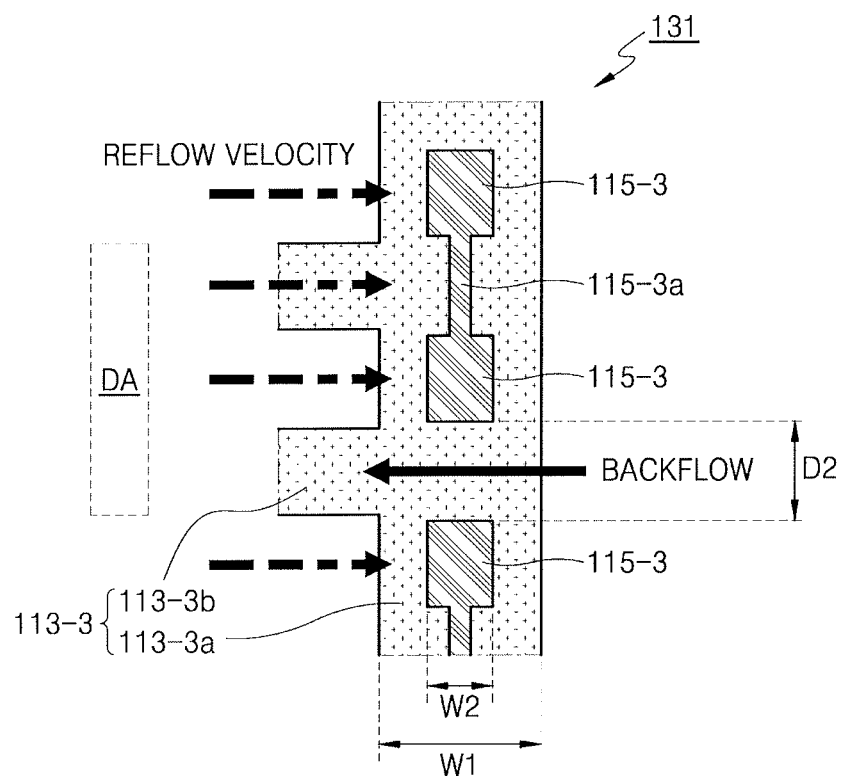
FIG. 9 illustrates a plan view showing another example of the first portion in the third dam.

Referring to FIGS. 8 and 9, examples of the first portion 131 of the third dam 130 will be described below.

Referring to FIG. 8, each of the dot patterns of the fourth layer 115-3 in the third dam 130 may have various shapes, e.g., a shape with rounded corners 115-31, a square shape 115-32, a triangle shape 115-33, etc. Referring to FIG. 9, some of the dot patterns of the fourth layer 115-3 may be connected to each other via a connecting portion 115-3a.

The fourth layer 115-3 may be modified variously provided that the fourth layer 115-3 has patterns spaced from one another by a predetermined distance.

A height from a surface of the substrate 100 to an uppermost portion of the third dam 130, that is, an upper surface of the fourth layer 115-3, may be equal to or greater than a height to an uppermost portion of the first dam 110, that is, an upper surface of the third layer 115-1. The height of the third dam 130 may be equal to or greater than that of the first dam 110. Accordingly, the reflow velocity of the organic material may be reduced. In addition, even when the height of the third dam 130 were to be equal to or greater than that of the first dam 110, the backflow of the organic material could still be allowed because of the effects of the dot patterns in the uppermost layer of the third dam 130.

Thus, the organic material that flows to the first dam 110 may be prevented from being trapped between the first dam 110 and the second dam 120.

In addition, generation of an edge tail due to the organic encapsulation layer 420 flowing beyond the second dam 120 may be prevented by setting a height of the second dam 120 to be greater than that of the first dam 110. Defects such as denting or tearing of the intermediate layer 320 due to use of the mask during the deposition process may be prevented by maintaining the distance between the mask and the substrate 100 in the deposition process of the intermediate layer 320.

In addition, the first layer 109-2 of the second dam 120 may clad the end portions of the first conductive layer SD1 of the first power voltage line 10, and the second layer 111-2 of the second dam 120 may clad the end portions of the second conductive layer SD2 of the first power voltage line 10 to prevent degradation of the conductive layers.

The second portion 132 and the third portion 133 of the third dam 130 may have the same structures as that of the first portion 131.

Referring to FIG. 6, a left portion of the drawing shows a structure of the pixel P of FIG. 4, and a right portion of the drawing shows a cross-section taken along a line VIA-VIB of FIG. 1.

In the cross-section taken along the line VIA-VIB, the buffer layer 101, the first gate insulating layer 103, and the second gate insulating layer 105 may be arranged on the substrate 100. A plurality of spider lines SPL may be provided on the second gate insulating layer 105. The plurality of spider lines SPL may extend from a driving circuit portion towards the terminal portion 30 (see FIG. 1) and may be spaced from one another.

The plurality of spider lines SPL may include the same material as that of the second storage capacitor plate CE2 of the storage capacitor Cst.

The interlayer insulating layer 107 may cover the spider lines SPL on the second gate insulating layer 105. The first power voltage line 10 and the second power voltage line 20 may be arranged on the interlayer insulating layer 107.

The first power voltage line 10 and the second power voltage line 20 may include the same material as that of the data line DL. In FIG. 6, the first power voltage line 10 and the second power voltage line 20 are shown as being single conductive layers, respectively. In some implementations, the first power voltage line 10 and/or the second power voltage line 20 may include two conductive layers connected to each other. For example, the first power voltage line 10 and/or the second power voltage line 20 may include the first conductive layer including the same material as that of the data line DL and the second conductive layer including the same material as that of the driving voltage line PL. The first conductive layer and the second conductive layer may be connected to each other via a conductive layer formed in the first planarization layer 109.

The fourth portion 134 of the third dam 130 may be arranged at a location that overlaps the first power voltage line 10 in the height direction. The first dam 110 and the second dam 120 may be sequentially arranged from the fourth portion 134 of the third dam 130 towards the end portion of the substrate 100.

The fourth portion 134 of the third dam 130 may include a first layer 111-3 including the same material as that of the second planarization layer 111, a second layer 113-3 including the same material as that of the pixel-defining layer 113, and a third layer 115-3 including the same material as that of the spacer 115.

The first dam 110 may include a first layer 111-1 including the same material as that of the second planarization layer 111, a second layer 113-1 including the same material as that of the pixel-defining layer 113, and a third layer 115-1 including the same material as that of the spacer 115.

The second dam 120 may include a first layer 109-2 including the same material as that of the first planarization layer 109, a second layer 111-2 including the same material as that of the second planarization layer 111, a third layer 113-2 including the same material as that of the pixel-defining layer 113, and a fourth layer 115-2 including the same material as that of the spacer 115.

Unlike the first portion 131 of the third dam 130 described above, in the fourth portion 134 of the third dam 130, the second layer 113-3 including the same material as that of the pixel-defining layer 113 may extend along the second direction, and the third layer 115-3, which is the uppermost layer in the height direction, may be successively arranged along the second direction.

Figure 10:
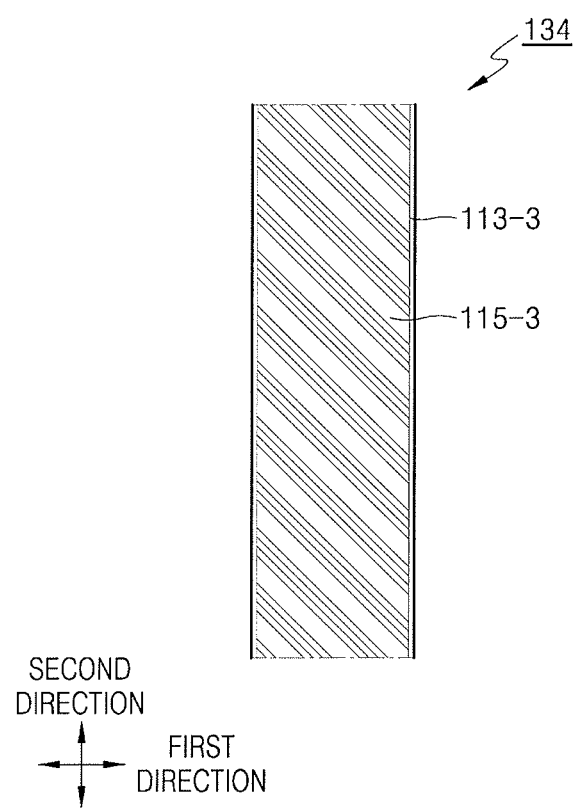
FIG. 10 illustrates a plan view of a fourth portion of a third dam.

Referring to FIG. 10, the second layer 113-3 in the fourth portion 134 of the third dam 130 may be formed without including a protrusion protruding towards the display area DA. The third layer 115-3 may be continuously arranged along the extending direction of the second layer 113-3 without a gap.

In the embodiment, the fourth portion 134 of the third dam 130 may be provided between the display area DA and the terminal portion 30. Various elements such as the first power voltage line 10, the second power voltage line 20, the spider lines SPL, and the plurality of terminals 31, 32, and 33 may be arranged between the display area DA and the terminal portion 30. Accordingly, a space for additionally forming the third dam 130 may be narrow. However, the second layer 113-3 and the third layer 115-3 in the fourth portion 134 of the third dam 130 extend along the second direction without a particular pattern. Accordingly, the dam may be arranged within a narrow space. The reflow velocity of the organic layer such as the monomer flowing from the display area DA to the terminal portion 30 may be reduced by the fourth portion 134 of the third dam 130.

The fourth portion 134 of the third dam 130 may partially overlap the first power voltage line 10 in the height direction. The first layer 111-3 may clad the end portion of the first power voltage line 10 to prevent degradation of the first power voltage line 10. In addition, the second layer 113-3 in the fourth portion 134 of the third dam 130 may be formed to clad an upper surface and side surfaces of the first layer 111-3 in order to ensure a processing margin when patterning the second layer 113-3 and the third layer 115-3 during a photolithography process. Thus, the heights of the second layer 113-3 and the third layer 115-3 may be stably ensured.

In the fourth portion 134 of the third dam 130, the second layer 113-3 and the third layer 115-3 may be formed in a process using the same mask. A width of an upper surface of the second layer 113-3 and a width of a lower surface of the third layer 115-3 may be substantially the same as each other.

In addition, generation of an edge tail due to an organic material forming the organic encapsulation layer 420 flowing beyond the second dam 120 may be prevented by setting a height of the second dam 120 to be greater than the height of the first and third dams 110 and 130. Defects such as denting or tearing of the intermediate layer 320 due to the presence of the mask during the deposition process may be prevented by maintaining the distance between the mask and the substrate 100 in the deposition process of the intermediate layer 320 by using the mask.

The first layer 109-2 of the second dam 120 may clad end portions of the second power voltage line 20 to prevent degradation of the conductive layer.

In the display apparatus 1 according to the above embodiment, the uppermost insulating layer of the third dam 130 in the height direction may have dot patterns at left, right, and upper sides, that is, three surfaces of the substrate 100. The uppermost insulating layer in the height direction of the fourth portion 134 of the third dam 130, located at a lower side of the substrate 100, for example, a side of the substrate 100 including the terminal portion 30, may be integrally formed without a dot pattern. In some implementations, the third dam 130 may vary.

Hereinafter, a display apparatus according to an embodiment will be described below with reference to FIGS. 11 to 15. Differences from the display apparatus 1 according to the above embodiment will be described below.

Figure 11:
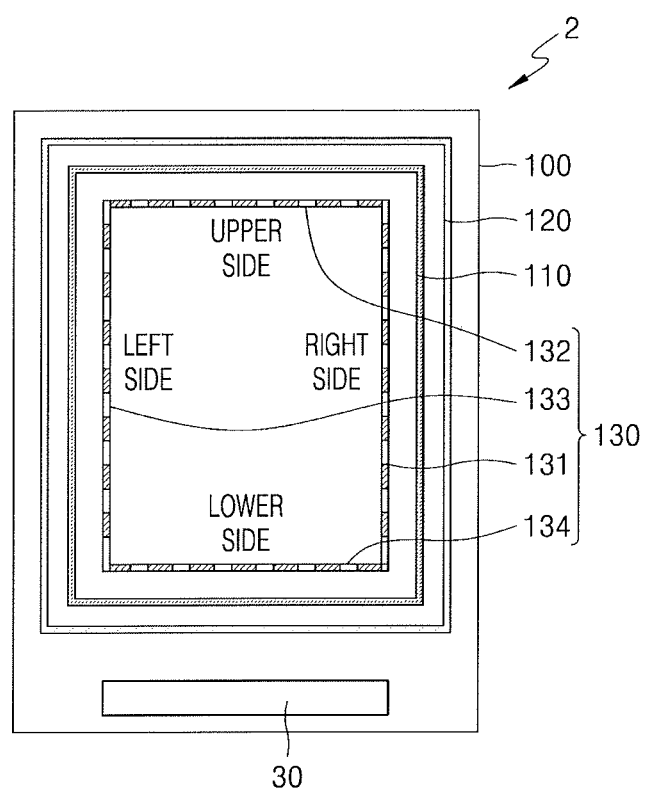
FIG. 11 illustrates a plan view of a display apparatus according to another embodiment.

Referring to FIG. 11, a display apparatus 2 according to an embodiment may include the third dam 130, the first dam 110, and the second dam 120 on the substrate 100.

The third dam 130 may include the first portion 131 at a right side of the substrate 100, the second portion 132 at an upper side of the substrate 100, the third portion 133 at a left side of the substrate 100, and the fourth portion 134 at a lower side of the substrate 100. Unlike the above embodiment, the uppermost insulating layer in the height direction of the third dam 130 may include dot patterns on all of the boundaries of the substrate 100.

Figure 12:
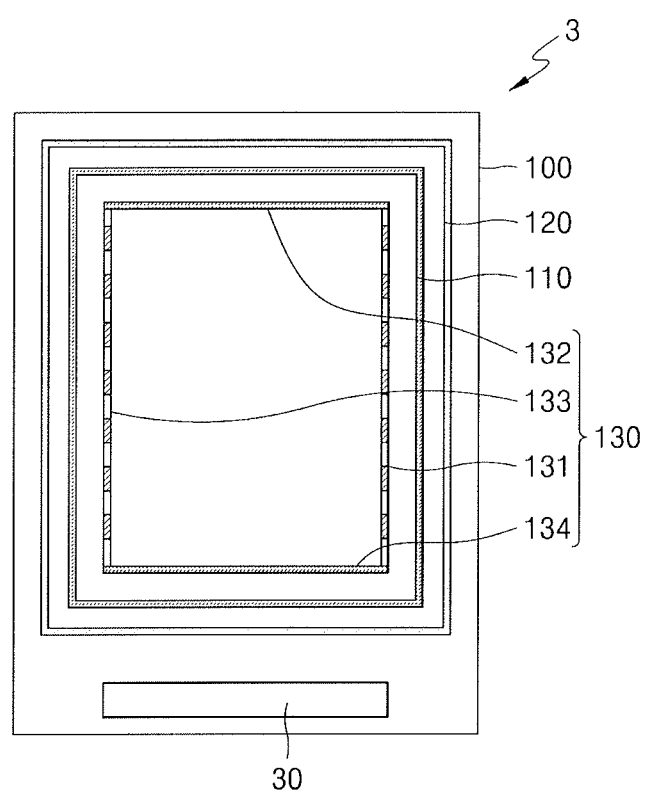
FIG. 12 illustrates a plan view of a display apparatus according to another embodiment.

Referring to FIG. 12, a display apparatus 3 according to an embodiment may include the third dam 130, the first dam 110, and the second dam 120 on the substrate 100.

The third dam 130 may include the first portion 131 at a right side of the substrate 100, the second portion 132 on an upper side of the substrate 100, the third portion 133 at a left side of the substrate 100, and the fourth portion 134 at a lower side of the substrate 100. In the embodiment, on a pair of boundaries facing each other of the substrate 100, that is, left and right sides of the substrate 100, the uppermost insulating layer in the height direction of the third dam 130 may be formed as dot patterns. On another pair of boundaries facing each other, that is, upper and lower sides of the substrate 100, the uppermost insulating layer in the height direction of the third dam 130 may be integrally formed without the dot patterns.

In some implementations, the uppermost insulating layer in the height direction of the third dam 130 may be formed as the dot patterns on the upper and lower sides of the substrate 100. The uppermost insulating layer in the height direction of the third dam 130 may be integrally formed without the dot patterns on the left and right sides of the substrate 100.

In some implementations, the dot patterns may be formed on neighboring boundaries of the substrate 100, for example, the left and upper sides, the upper and right sides, the right and lower sides, and the lower and left sides, and on remaining regions, the uppermost insulating layer in the height direction of the third dam 130 may be integrally formed without the dot patterns.

Figure 13:
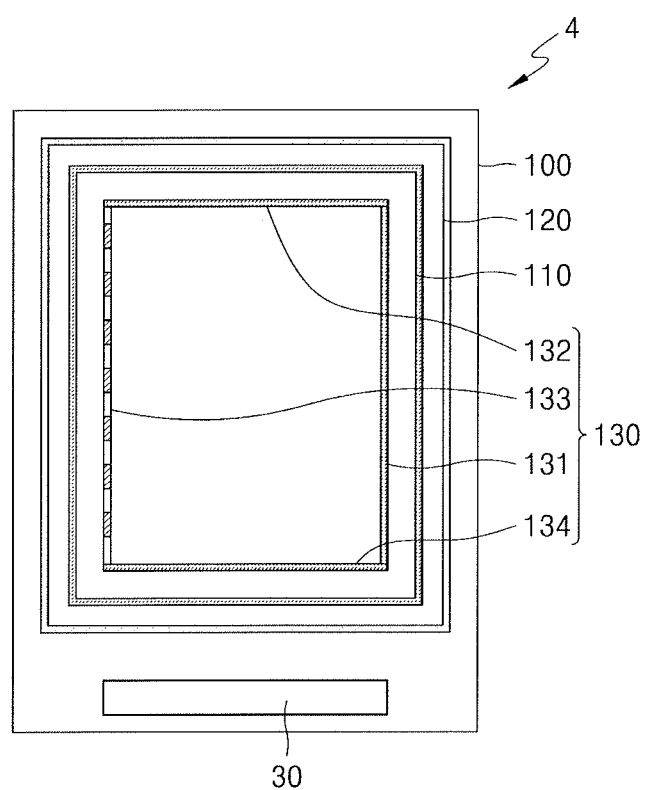
FIG. 13 illustrates a plan view of a display apparatus according to another embodiment.

Referring to FIG. 13, a display apparatus 4 according to another embodiment includes the third dam 130, the first dam 110, and the second dam 120 on the substrate 100.

The third dam 130 includes the first portion 131 at a right side of the substrate 100, the second portion 132 on an upper portion of the substrate 100, the third portion 133 at a left side of the substrate 100, and the fourth portion 134 at a lower side of the substrate 100. In the embodiment, the dot patterns of the uppermost insulating layer in the height direction of the third dam may be only formed on one surface of the substrate 100, for example, the left side of the substrate 100. On the remaining three surfaces, for example, the right, lower, and upper sides of the substrate 100, the uppermost insulating layer in the height direction of the third dam 130 may be formed integrally without the dot patterns. In some implementations, the dot patterns may be formed at the uppermost insulating layer in the height direction of the third dam 130 on one of the boundaries of the substrate 100.

Figure 14:
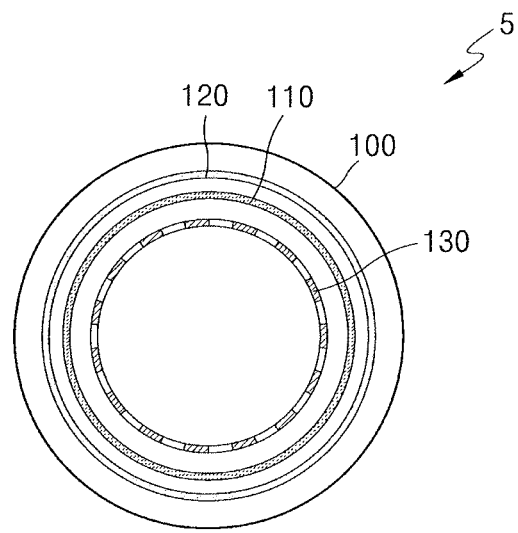
FIG. 14 illustrates a plan view of a display apparatus according to another embodiment.

Referring to FIG. 14, a display apparatus 5 according to another embodiment may include a third dam 130, a first dam 110, and a second dam 120 on the substrate 100. The display apparatus 5 may be a circular display, and an uppermost insulating layer in the height direction of the third dam 130 may be formed as dot patterns on an entire circular boundary.

In the third dam 130 of the embodiment, an insulating layer of a next uppermost layer in the height direction may extend along a circumferential direction and an uppermost insulating layer in the height direction may be formed as dot patterns on the next uppermost insulating layer extending in the circumferential direction, like in the first portion 131 of the third dam 130 according to the above embodiment.

Figure 15:
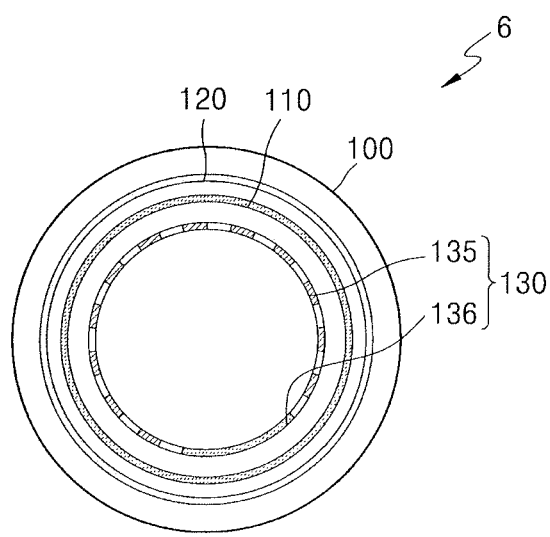
FIG. 15 illustrates a plan view of a display apparatus according to another embodiment.

Referring to FIG. 15, a display apparatus 6 according to an embodiment may include a third dam 130, a first dam 110, and a second dam 120 on the substrate 100.

The display apparatus 6 may be a circular display, in which the third dam 130 is arranged along a circumference. A portion 135 of the third dam may include an uppermost insulating layer in the height direction including dot patterns and remaining portion 136 of the third dam 130 may include an uppermost insulating layer in the height direction formed integrally without dot patterns.

In the display apparatuses 2, 3, 4, 5, or 6 illustrated in FIGS. 11 to 15, the third dam having an uppermost insulating layer in the height direction formed as dot patterns may be provided between the display area and the first dam to reduce a reflow velocity of organic material when forming the organic encapsulation layer. The dot patterns may allow organic material that flows to the first dam 110 to be flowed back as backflow to the display area. Thus, an amount of the organic material may be controlled.

According to the embodiments, the third dam having a height that is equal to or greater than that of the first dam may be provided between the display area and the first dam, and thus, the flow velocity of the organic material may be reduced.

Also, the uppermost layer in the height direction of the third dam may be formed to have dot patterns that are spaced from one another to cause the organic material to flow back to the display area. Thus, overflow of the organic material within a narrow dead space may be effectively controlled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
   a substrate;
   a display area on the substrate, the display area including a plurality of pixels;
   a non-display area outside the display area;
   a first dam surrounding the display area;
   a second dam outside the first dam, the second dam surrounding the first dam;
   a third dam between the display area and the first dam, the third dam including a first insulating layer and a second insulating layer, the second insulating layer being on the first insulating layer; and
   a thin film encapsulation layer covering the display area, the thin film encapsulation layer including at least one inorganic encapsulation layer and at least one organic encapsulation layer,
   wherein the third dam includes a first region in which the second insulating layer is spaced along a direction in which the first insulating layer extends, and a second region in which the second insulating layer is continuously present along the direction in which the first insulating layer extends, the second region not overlapping the first region.

2. The display apparatus as claimed in claim 1, wherein, in the first region, the first insulating layer includes an extension that extends along the direction in which the first insulating layer extends, and a plurality of protrusions protruding from the extension towards the display area.

3. The display apparatus as claimed in claim 1, wherein, in the first region, a width of the first insulating layer is greater than a width of the second insulating layer.

4. The display apparatus as claimed in claim 1, wherein, in the first region, a height from a surface of the substrate to an uppermost portion of the second insulating layer is equal to or greater than a height from the surface of the substrate to an uppermost portion of the first dam.

5. The display apparatus as claimed in claim 1, wherein:
   each of the pixels includes:
      a first electrode;
      an emission layer on the first electrode; and
      a second electrode on the emission layer, the second electrode being arranged commonly throughout the plurality of pixels, and
   a first power voltage line supplying a first power to each pixel is located in the non-display area and a second power voltage line is spaced from the first power voltage line, the second power voltage supplying a second power to the second electrode.

6. The display apparatus as claimed in claim 5, wherein the first region of the third dam partially overlaps the second power voltage line.

7. The display apparatus as claimed in claim 5, wherein the second dam clads end portions of the second power voltage line.

8. The display apparatus as claimed in claim 5, wherein the first dam overlaps the second power voltage line.

9. The display apparatus as claimed in claim 5, wherein the second region of the third dam partially overlaps the first power voltage line.

10. The display apparatus as claimed in claim 9, wherein, in the second region, a width of an upper surface of the first insulating layer is equal to a width of a lower surface of the second insulating layer.

11. The display apparatus as claimed in claim 9, wherein, in the second region, a height from a surface of the substrate to an uppermost portion of the second insulating layer is equal to a height from the surface of the substrate to an uppermost portion of the first dam.

12. The display apparatus as claimed in claim 5, further comprising:
  a pixel-defining layer covering end portions of the first electrode; and
  a spacer on the pixel-defining layer,
  wherein the first insulating layer includes a same material as a material of the pixel-defining layer,
  and the second insulating layer includes a same material as a material of the spacer.

13. The display apparatus as claimed in claim 12, wherein:
  a thin film transistor including an active layer, a gate electrode, a source electrode, and a drain electrode is between each pixel and the substrate,
  a third insulating layer is in the display area and the non-display area, the third insulating layer including at least one of insulating layers arranged between the active layer, the gate electrode, the source electrode, and the drain electrode, and
  the third dam further includes the third insulating layer between the substrate and the first insulating layer.

14. The display apparatus as claimed in claim 13, wherein the second dam includes:
  the third insulating layer;
  the first insulating layer on the third insulating layer; and
  the second insulating layer on the first insulating layer.

15. The display apparatus as claimed in claim 13, wherein:
  the third insulating layer includes a first planarization layer and a second planarization layer,
  the first planarization layer is in the display area and the non-display area, and the second planarization layer is on the first planarization layer, and
  the second dam and the third dam both include a same material as the first planarization layer and the second planarization layer.

16. The display apparatus as claimed in claim 15, wherein the first dam includes a same material as one of the first planarization layer and the second planarization layer.

17. The display apparatus as claimed in claim 1, wherein a height from a surface of the substrate to an uppermost portion of the second dam is greater than a height from the surface of the substrate to an uppermost portion of the first dam.

18. The display apparatus as claimed in claim 1, wherein:
  each of the at least one inorganic encapsulation layer includes a first inorganic encapsulation layer and a second inorganic encapsulation layer, and
  each of the at least one organic encapsulation layer is between the at least one first inorganic encapsulation layer and the second inorganic encapsulation layer, respectively.

19. The display apparatus as claimed in claim 18, wherein:
  the at least one first inorganic encapsulation layer and the second inorganic encapsulation layer are in direct contact with each other on an outer portion of the second dam.

20. The display apparatus as claimed in claim 5, wherein the second electrode extends to the non-display area and partially covers the first region of the third dam.

21. A display apparatus, comprising:
  a substrate;
  a display area on the substrate, the display area including a plurality of pixels;
  a non-display area outside the display area;
  a first dam surrounding the display area;
  a second dam outside the first dam, the second dam surrounding the first dam;
  a third dam between the display area and the first dam, the third dam including a first insulating layer and a second insulating layer on the first insulating layer; and
  a thin film encapsulation layer covering the display area, the thin film encapsulation layer including a first inorganic encapsulation layer, a second inorganic encapsulation layer, and an organic encapsulation layer between the first inorganic encapsulation layer and the second inorganic encapsulation layer, wherein:
  the first insulating layer of the third dam includes an extension that extends along the direction in which the first insulating layer extends, and a plurality of protrusions protruding from the extension towards the display area, and
  the second insulating layer of the third dam is on the extension in a form of dot patterns spaced apart from one another along a direction in which the first insulating layer extends.

22. The display apparatus as claimed in claim 21, wherein:
  the first dam and the second dam each include the first insulating layer and the second insulating layer, and
  the second insulating layers of the first dam and the second dam are continuously arranged along a direction in which the first insulating layer extends.

23. The display apparatus as claimed in claim 22, wherein each of the plurality of pixels includes a first electrode, an emission layer on the first electrode, and a second electrode on the emission layer, the second electrode being arranged commonly throughout the plurality of pixels,
  the display apparatus further including:
  a pixel-defining layer covering end portions of the first electrode, a spacer on the pixel-defining layer, and a thin film transistor between each of the pixels and the substrate, the thin film transistor including an active layer, a gate electrode, a source electrode, and a drain electrode,
  a third insulating layer in the display area and the non-display area, the third insulating layer including at least one insulating layer arranged between the active layer, the gate electrode, the source electrode, and the drain electrode,
  wherein the first insulating layer includes a same material as a material of the pixel-defining layer, and
  the second insulating layer includes a same material as a material of the spacer.

24. The display apparatus as claimed in claim 23, wherein the first dam and the third dam each further include a third insulating layer between the substrate and the first insulating layer.

25. The display apparatus as claimed in claim 23, wherein heights from a surface of the substrate to an uppermost portion of the first dam and to an uppermost portion of the third dam are equal to or greater than a height from the surface of the substrate to an uppermost portion of the second dam.

* * * * *